(12) United States Patent
Wells et al.

(10) Patent No.: US 7,456,452 B2
(45) Date of Patent: Nov. 25, 2008

(54) LIGHT SENSOR HAVING UNDULATING FEATURES FOR CMOS IMAGER

(75) Inventors: David Wells, Boise, ID (US); Shane P. Leiphart, Bend, OR (US)

(73) Assignee: Micron Technology, Inc., Boise, ID (US)

( * ) Notice: Subject to any disclaimer, the term of this patent is extended or adjusted under 35 U.S.C. 154(b) by 111 days.

(21) Appl. No.: 11/300,378

(22) Filed: Dec. 15, 2005

(65) Prior Publication Data
US 2007/0138590 A1 Jun. 21, 2007

(51) Int. Cl.
*H01L 31/062* (2006.01)
*H01L 31/113* (2006.01)

(52) U.S. Cl. .................. 257/292; 257/436; 257/466; 257/E27.131; 257/E27.151

(58) Field of Classification Search .............. 257/252, 257/462, 436, 443, 465, 292, 466, E27.122, 257/E27.131, E27.133, E31.037–E31.039
See application file for complete search history.

(56) References Cited

U.S. PATENT DOCUMENTS

| | | | |
|---|---|---|---|
| 3,987,455 A | | 10/1976 | Olyphant, Jr. |
| 4,277,793 A | * | 7/1981 | Webb .................. 257/436 |
| 4,639,600 A | | 1/1987 | Laurer |
| 4,684,952 A | | 8/1987 | Munson et al. |
| 5,391,259 A | | 2/1995 | Cathey et al. |
| 6,249,346 B1 | | 6/2001 | Chen et al. |
| 6,278,145 B1 | * | 8/2001 | Kato .................. 257/292 |
| 6,416,376 B1 | | 7/2002 | Wilson |
| 6,611,037 B1 | * | 8/2003 | Rhodes ............... 257/466 |
| 6,767,759 B2 | | 7/2004 | Rhodes |
| 2001/0001562 A1 | * | 5/2001 | Orava et al. ........ 348/302 |
| 2001/0042864 A1 | * | 11/2001 | Kato .................. 257/79 |
| 2004/0004668 A1 | | 1/2004 | Namazue et al. |
| 2005/0040440 A1 | * | 2/2005 | Murakami ........... 257/225 |
| 2006/0011955 A1 | * | 1/2006 | Baggenstoss ....... 257/292 |

FOREIGN PATENT DOCUMENTS

| | | |
|---|---|---|
| EP | 1 667 233 A2 | 6/2006 |
| JP | 60 090474 | 5/1985 |
| WO | WO 2006/019968 A1 | 2/2006 |

OTHER PUBLICATIONS

International Search Report date of mailing May 25, 2007.
R. H. Nixon, et al., "256 x 256 CMOS Active Pixel Sensor Camera-on-a-Chip", *IEEE Journal of Solid State Circuits*, vol. 31, No. 12, Dec. 1996.
Mendis, et al., "CMOS Active Pixel Image Sensor", *IEEE Transactions on Electron Devices*, vol. 41, No. 3, Mar. 1994.

* cited by examiner

*Primary Examiner*—Theresa T. Doan
*Assistant Examiner*—Sarah K Salerno
(74) *Attorney, Agent, or Firm*—Dickstein Shapiro LLP

(57) ABSTRACT

Light sensors in an imager having sloped features including, but not limited to, hemispherical, v-shaped, or other sloped shapes. Light sensors having such a sloped feature can redirect incident light that is not absorbed by one portion of the photosensor to another portion of the photosensor for absorption there.

33 Claims, 13 Drawing Sheets

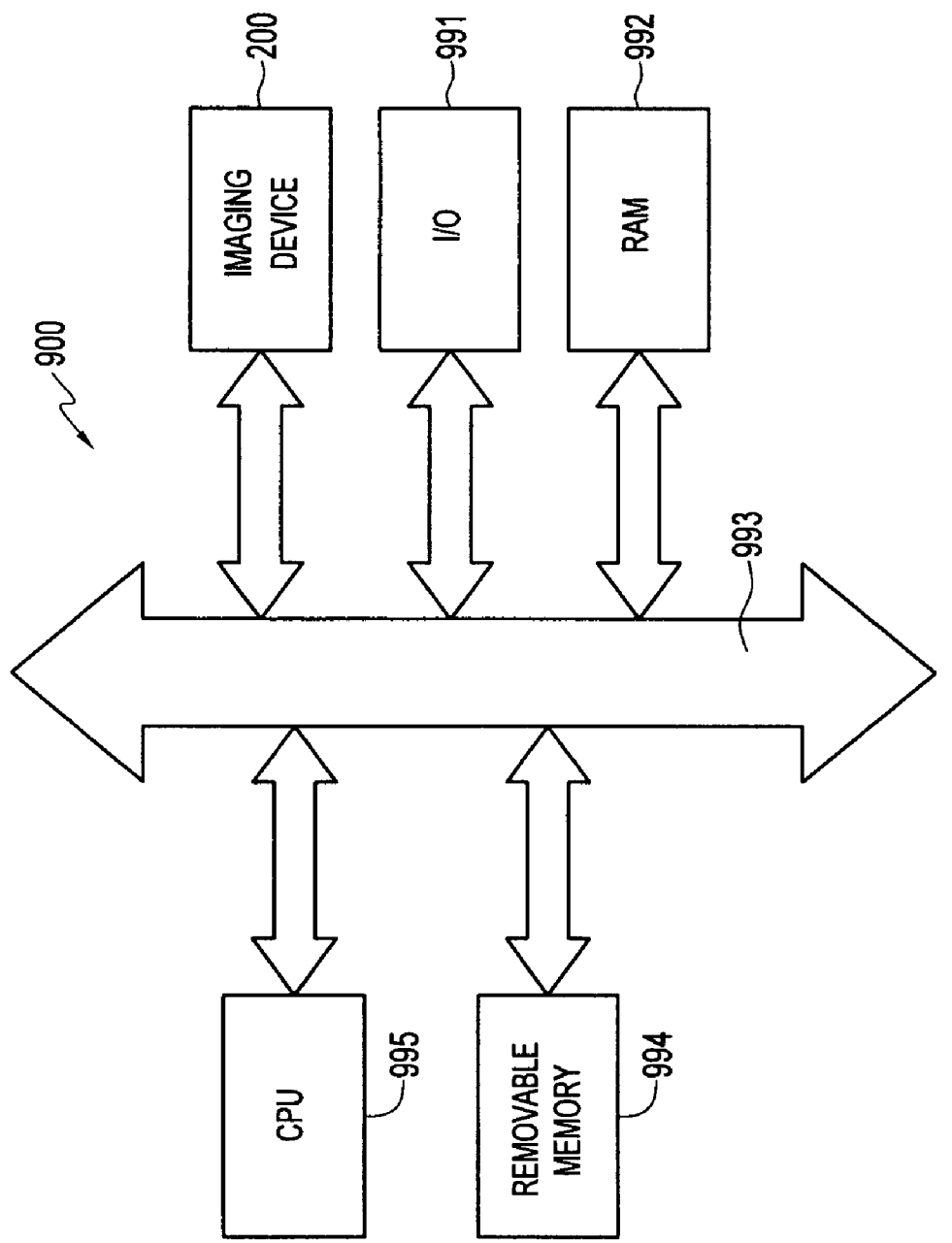

LIGHT SENSOR HAVING UNDULATING FEATURES FOR CMOS IMAGER

FIELD OF THE INVENTION

The present invention relates generally to the field of image sensors, and more particularly to solid state image sensors.

BACKGROUND OF THE INVENTION

Solid state image sensors are increasingly being used in a wide variety of imaging applications as low cost imaging devices. One such sensor is a CMOS image sensor. A CMOS image sensor circuit includes a focal plane array of pixel cells, each one of the cells includes a photogate, photoconductor, or photodiode having an associated charge accumulation region within a substrate for accumulating photo-generated charge. Each pixel cell may include a transistor for transferring charge from the charge accumulation region to a sensing node, and a transistor for resetting the sensing node to a predetermined charge level prior to charge transference. The pixel cell may also include a source follower transistor for receiving and amplifying charge from the sensing node and an access transistor for controlling the readout of the cell contents from the source follower transistor.

In a CMOS image sensor, the active elements of a pixel cell perform the necessary functions of: (1) photon to charge conversion; (2) accumulation of image charge; (3) transfer of charge to the sensing node accompanied by charge amplification; (4) resetting the sensing node to a known state; (5) selection of a pixel for readout; and (6) output and amplification of a signal representing pixel charge from the sensing node.

CMOS image sensors of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046-2050 (1996); and Mendis et al., "CMOS Active Pixel Image Sensors," IEEE Transactions on Electron Devices, Vol. 41(3), pp. 452-453 (1994). See also U.S. Pat. Nos. 6,177,333 and 6,204,524, which describe the operation of conventional CMOS image sensors and are assigned to Micron Technology, Inc., the contents of which are incorporated herein by reference.

An electrical schematic diagram of a conventional CMOS four-transistor (4T) pixel cell 10 is shown in FIG. 1. The CMOS pixel cell 10 generally comprises a photosensor 14 for generating and collecting charge generated by light incident on the pixel cell 10, and a transfer transistor 17 for transferring photoelectric charges from the photosensor 14 to a sensing node, typically a floating diffusion region 5. The floating diffusion region 5 is electrically connected to the gate of an output source follower transistor 19. The pixel cell 10 also includes a reset transistor 16 for resetting the floating diffusion region 5 to a predetermined voltage $V_{aa-pix}$; and a row select transistor 8 for outputting a reset signal $V_{rst}$ and an image signal $V_{sig}$ from the source follower transistor 19 to an output terminal in response to an address signal.

FIG. 2 is a cross-sectional view of a portion of the pixel cell 10 of FIG. 1 showing the photosensor 14, transfer transistor 17 and reset transistor 16. The exemplary CMOS pixel cell 10 has a photosensor 14 that may be formed as a pinned photodiode. The photodiode photosensor 14 has a p-n-p construction comprising a p-type surface layer 13 and an n-type photodiode region 12 within a p-type active layer 11. The photosensor 14 is adjacent to and partially underneath the transfer transistor 17. The reset transistor 16 is on a side of the transfer transistor 17 opposite the photodiode photosensor 14. As shown in FIG. 2, the reset transistor 16 includes a source/drain region 2. The floating diffusion region 5 is between the transfer and reset transistors 17, 16. An isolation trench 18 surrounds the pixel, isolating it from adjacent pixels.

In the CMOS pixel cell 10 depicted in FIGS. 1 and 2, electrons are generated by light incident on the photodiode photosensor 14 and are stored in the n-type photodiode region 12. These charges are transferred to the floating diffusion region 5 by the transfer transistor 17 when the transfer transistor 17 is activated. The source follower transistor 19 produces an output signal based on the transferred charges. A maximum output signal is proportional to the number of electrons extracted from the photosensor 14. However, as seen in FIG. 2, a certain amount of incident light is not absorbed by the photosensor 14, but rather, is reflected from its surface and lost. The loss of this incident light decreases responsivity, dynamic range and quantum efficiency of the imager.

Accordingly, it is desirable to have a photosensor that better captures reflected incident light and directs it to the photosensor so the light is absorbed and detected.

BRIEF SUMMARY OF THE INVENTION

Exemplary embodiments of the invention provide light sensors in an imager having sloped features including, but not limited to, hemispherical, v-shaped, or other sloped shapes. Light sensors having such a sloped feature can redirect unabsorbed incident light such that the light reflected from one portion of a light sensor is directed to another location on the same light sensor. This improves the amount of incident light which is absorbed.

BRIEF DESCRIPTION OF THE DRAWINGS

These and other features of the various embodiments of the invention will be more readily understood from the following detailed description of the invention which is provided in connection with the accompanying drawings:

FIG. 5a is a three-dimensional view of one configuration of the embodiment of FIG. 4a;

FIG. 5b is a three-dimensional view of another configuration of the embodiment of FIG. 4a;

FIG. 6b is a plan view of an array of pixels of FIG. 6a;

FIG. 11 is a block diagram of a processing system including the imaging device of FIG. 10.

DETAILED DESCRIPTION OF THE INVENTION

In the following detailed description, reference is made to the accompanying drawings which form a part hereof and illustrate specific exemplary embodiments by which the invention may be practiced. It should be understood that like reference-numerals represent like-elements throughout the drawings. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, gallium arsenide, or other semiconductor material, for example.

The term "pixel" or "pixel cell" refers to a picture element unit cell containing a photosensor and transistors for converting light radiation to an electrical signal. For purposes of illustration, a representative pixel is illustrated in the figures and description herein and, typically, fabrication of all pixels in an imager pixel array will proceed simultaneously in a similar fashion. Moreover, while a four-transistor pixel cell is described, the invention is not limited to such an embodiment. The invention may be employed with any typical electrical pixel architecture, such as a two-transistor, three-transistor, five- or more transistor pixel cells. The invention is also not limited to CMOS pixels and may be employed in pixels of solid state imagers, a CCD imager being just one example of another type of solid state imager.

The term "light" refers to electromagnetic radiation that can produce a visual sensation (visible light) as well as electromagnetic radiation outside of the visible spectrum. In general, light as used herein is not limited to visible radiation, but refers more broadly to the entire electromagnetic spectrum, particularly electromagnetic radiation that can be converted by a solid state photosensor into a useful signal.

Figure 1:
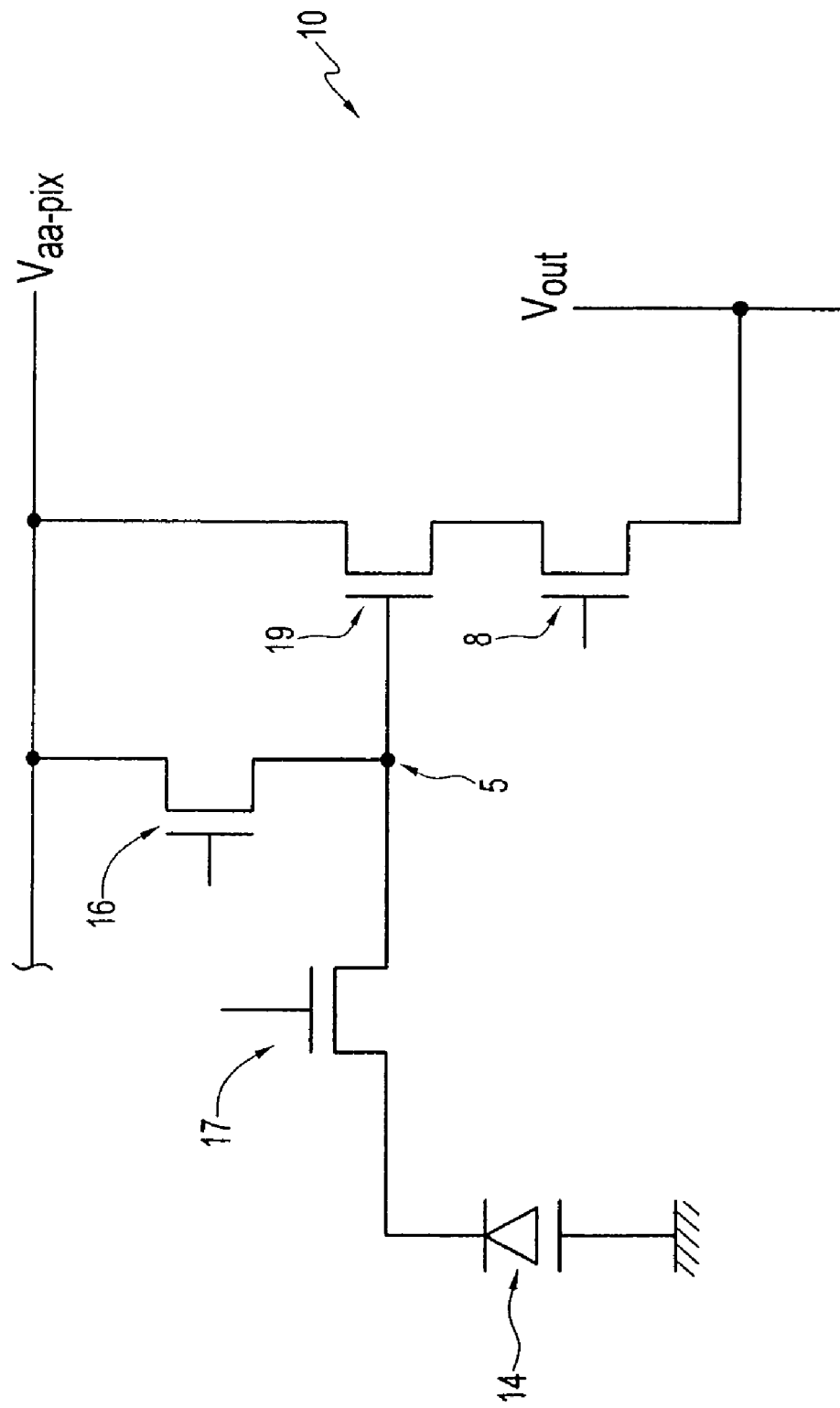
FIG. 1 is a schematic diagram of a convention four-transistor (4T) pixel cell.
Figure 2:
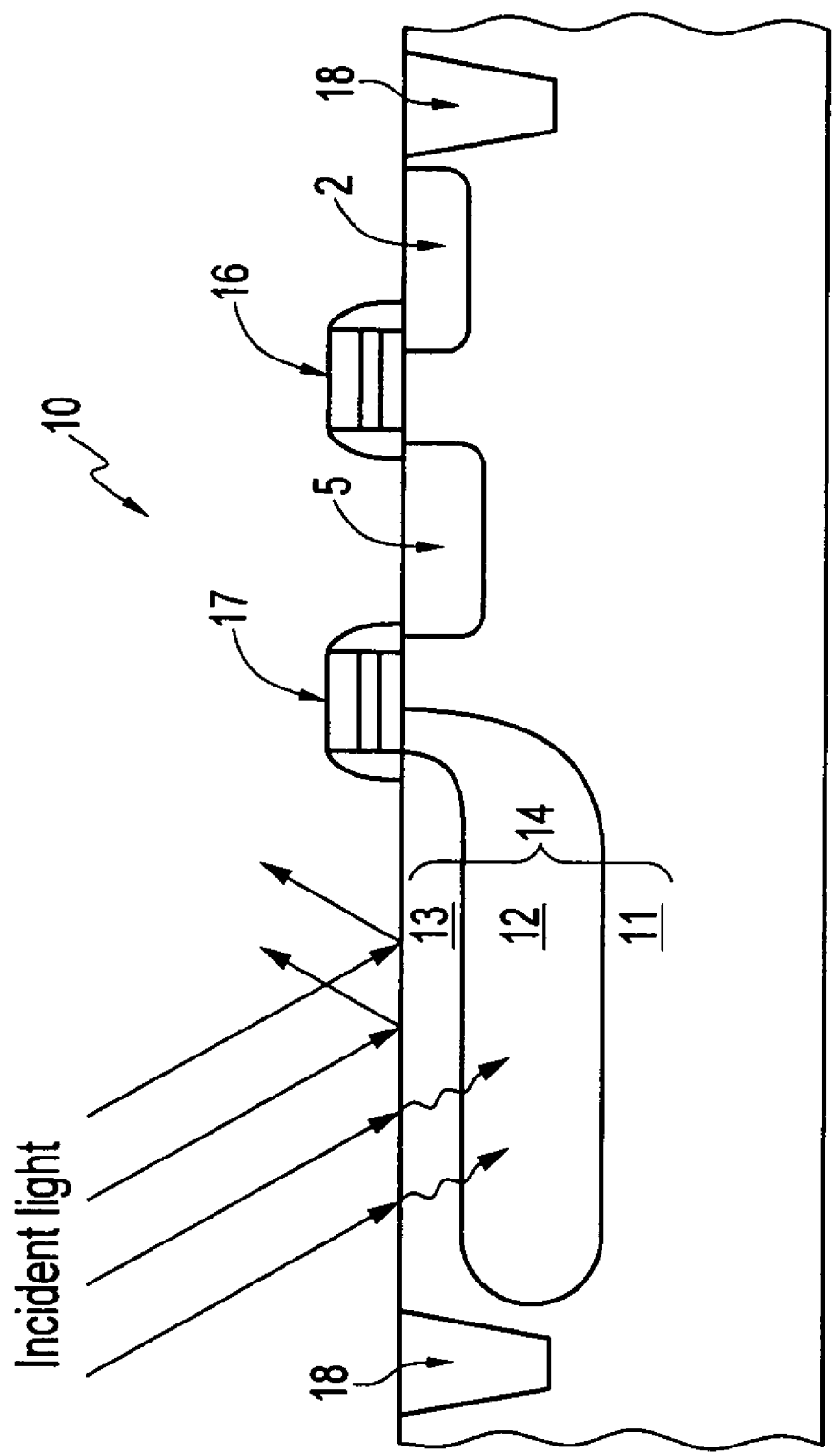
FIG. 2 is a cross-sectional view of a fabricated portion of the FIG. 1 pixel cell.
Figure 3:
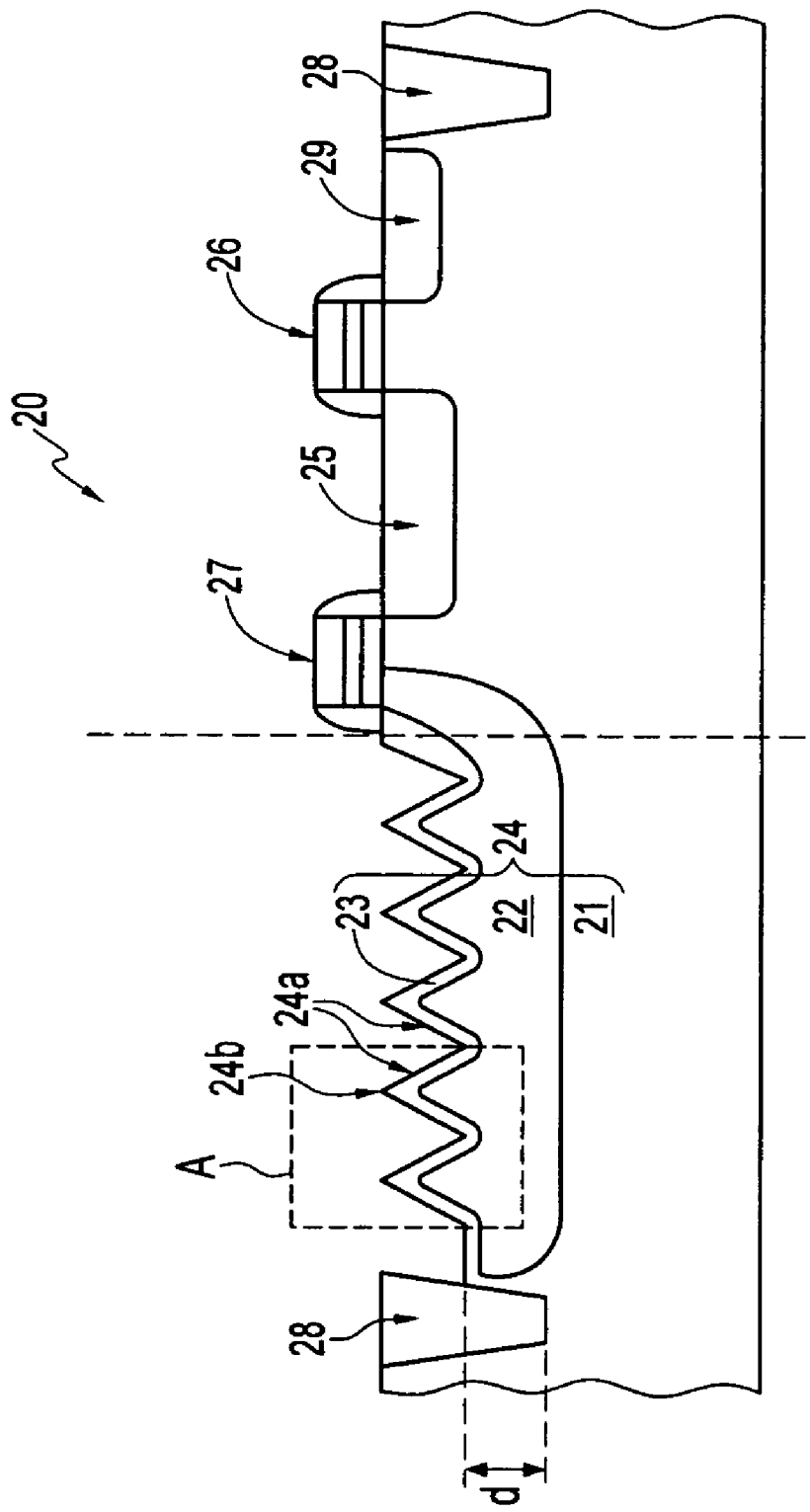
FIG. 3 is a cross-sectional view of a fabricated pixel cell in accordance with an exemplary embodiment the present invention.

Referring now to the drawings, where like elements are designated by like reference numerals, FIG. 3 illustrates a cross-section of a pixel cell 20 according to an exemplary embodiment, which is electrically schematically similar to the pixel cell 10 of FIG. 1. The cross-sectional view of pixel cell 20 shows a photodiode photosensor 24, transfer transistor 27 and reset transistor 26. Photodiode photosensor 24 is formed as a pinned photodiode having a p-n-p construction comprising a p-type surface layer 23 and an n-type photodiode region 22 within a p-type active layer 21. The photodiode photosensor 24 is adjacent to and partially underneath the transfer transistor 27. The reset transistor 26 is on a side of the transfer transistor 27 opposite the photodiode photosensor 24. As shown in FIG. 3, the reset transistor 26 includes a source/drain region 29. The floating diffusion region 25 is between the transfer and reset transistors 27, 26. Isolation trenches 28 are formed in the substrate. It should be noted that the bottom of the isolation trench 28 is deeper than the lowest top surface of the silicon substrate by a depth of d, which is preferably greater than 2000 Å. Although the photodiode photosensor 24 is shown as a P—N—P photodiode, it can also be formed as an N—P—N photodiode as would be understood by those skilled in the art.

Figure 4A:
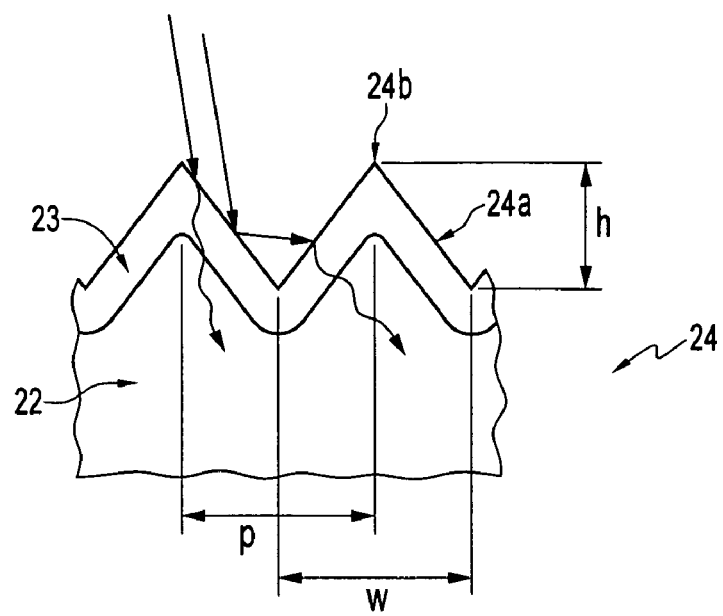
FIG. 4a is an expanded cross-sectional view of region A of FIG. 3.

The photodiode photosensor 24 does not have a planar upper surface. It has instead an upper surface profile which provides slanted or curved sidewalls capable of directing light reflected off one portion of the photosensor to another portion for the photosensor for capture. In the FIG. 3 embodiment, the upper surface has a series of undulating features forming side walls 24a that form a tapered peak 24b, shown in greater detail in FIG. 4a, which is an expanded cross-section view of region A of FIG. 3. Region A, as shown in FIG. 4a, has a v-shaped cross-sectional profile; however, other cross-sectional profiles, e.g., more rounded cross-sectionals and a u-shaped peak, would also work. Some of the incident light is absorbed by the photosensor 24, however, some of the incident light is reflected off the surface of the p-type surface layer 23. With the v-shaped configuration illustrated in FIG. 3, the light that is reflected off the surface of the p-type surface layer 23 is redirected to another location on the photosensor 24 to have another chance at being absorbed into the photosensor 24.

If light is not absorbed at that location, it may be reflected and again redirected to another location on the photosensor 24 to have yet another chance at being absorbed into the photosensor 24. While multiple redirection of reflected light may occur in any embodiment, it is illustrated in the embodiments of FIGS. 4b and 4c, for example, discussed below.

Figure 4B:
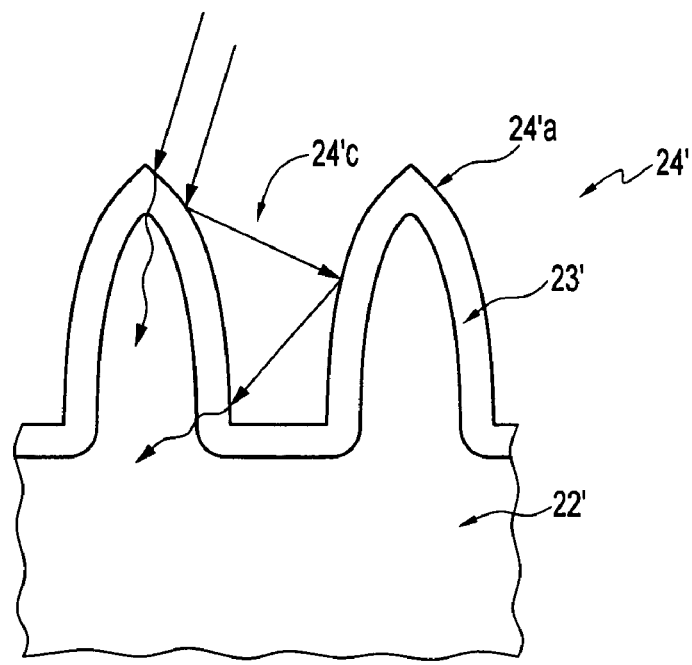
FIG. 4b is an expanded cross-sectional view of another exemplary embodiment of the present invention.

FIG. 4b is an expanded cross-section view of another embodiment, wherein the photosensor 24' of a pixel cell (e.g., pixel cell 20 of FIG. 3) has curved sloped side walls 24'a with a u-shaped trench 24'c configuration. While FIG. 4b shows a flat-bottomed trench 24'c, it may also have a rounded bottom or v-shaped bottom. Again, sidewalls 24'a are provided in the upper surface profile of photosensor 24' capable of redirecting reflected light to from one portion of the photosensor to another.

Figure 4C:
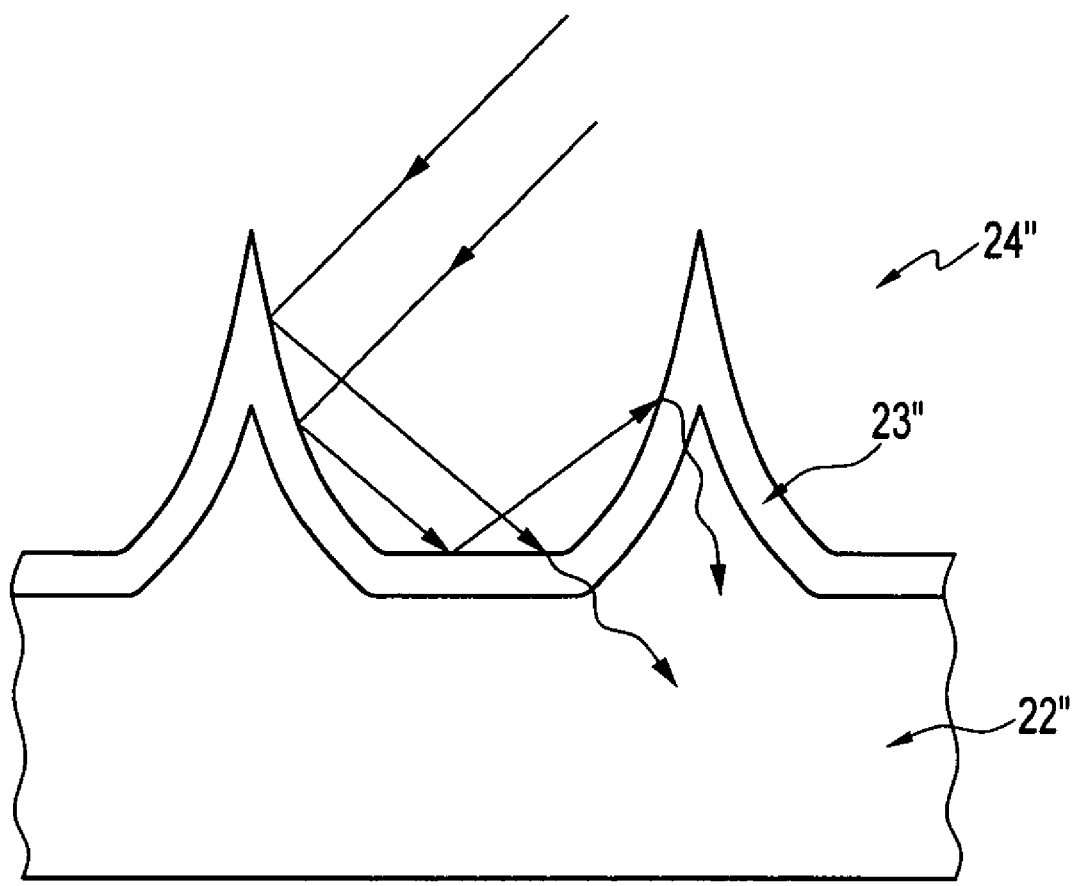
FIG. 4c is an expanded cross-sectional view of another exemplary embodiment of the present invention.

FIG. 4c is an expanded cross-sectional view of another embodiment, wherein the photosensor 24" of a pixel cell (e.g., pixel cell 20 of FIG. 3) has sloped features with a u-shaped trench configuration having pointed tips, or peaks. The various shapes of the tips and trenches may be obtained by selecting different methods of masking and/or etching, as will be described in more detail below. While FIG. 4c shows a flat-bottomed trench, it may also have a rounded bottom or a v-shaped bottom.

Figure 5A:
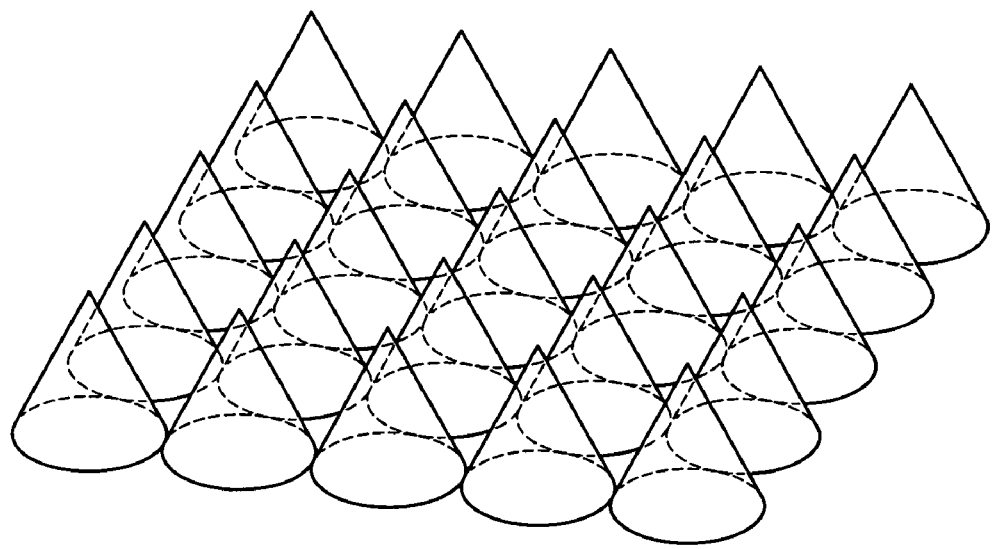

Referring back to the embodiment of FIGS. 3 and 4a, the v-shaped cross-section may have a cone shape, in three-dimensions, as shown in FIG. 5a. Generally, the cone may have a height h of approximately 2.0 µm and a width or diameter w of approximately 2.0 µm. However, the diameter of the cones and/or the spacing between them may be selected to optimize capture of specific colors having different wavelengths. For example, the pitch p, or the distance between the peaks of the cones is preferably not less than approximately a quarter of the wavelength of the desired wavelength of light, i.e., $p \geq \frac{1}{4} \lambda$.

Figure 5B:
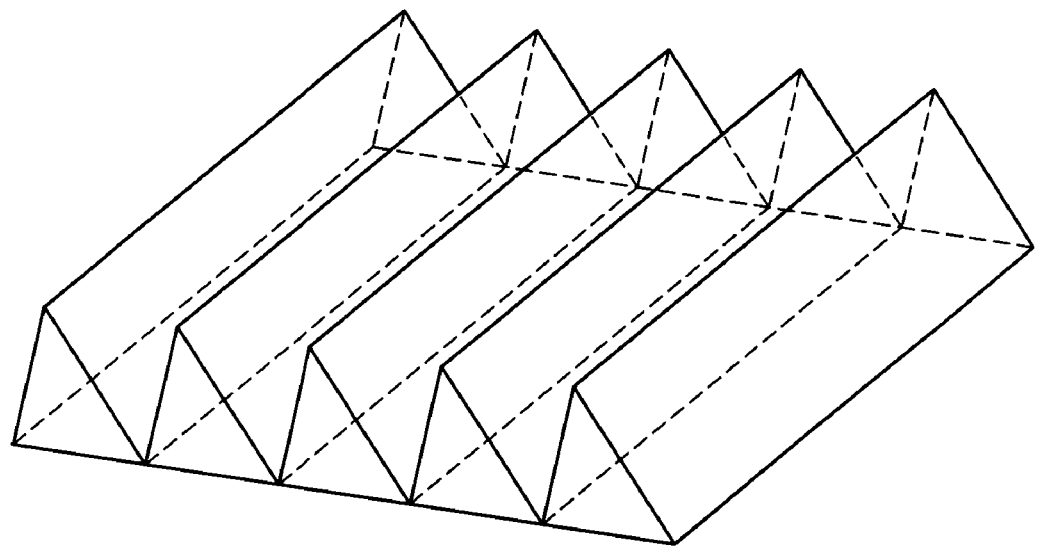

Alternatively, the v-shaped cross-section may have a prism shape, as shown in FIG. 5b. Like the cone-shaped configuration illustrated in FIG. 5a, the prisms of FIG. 5b may have a height h of approximately 2.0 μm and a width w of approximately 2.0 μm. However, the dimensions of the prisms and/or the spacing between them may be selected to optimize capture of specific colors having different wavelengths. For example, the pitch p, or the distance between the peaks of the prism is preferably not less than approximately a quarter of the wavelength of the desired wavelength of captured light, i.e., $p \geq \frac{1}{4} \lambda$.

Generally, a photosensor according to the present invention has a greater signal-to-noise ratio than a prior art photosensor. However, there may still be some scatter due to a minimal amount of incident light that is never absorbed by the photosensor of the present invention. For instance, a photosensor having a cone-shaped configuration has a greater surface area than a photosensor having a prism-shaped configuration, however a cone-shaped configuration may have a tendency to scatter a greater amount of light to neighboring pixels. Therefore, dimensions and spacing of both cone- and prism-shaped configurations may be selected to increase surface area for photon capture and minimize scatter.

Figure 6A:
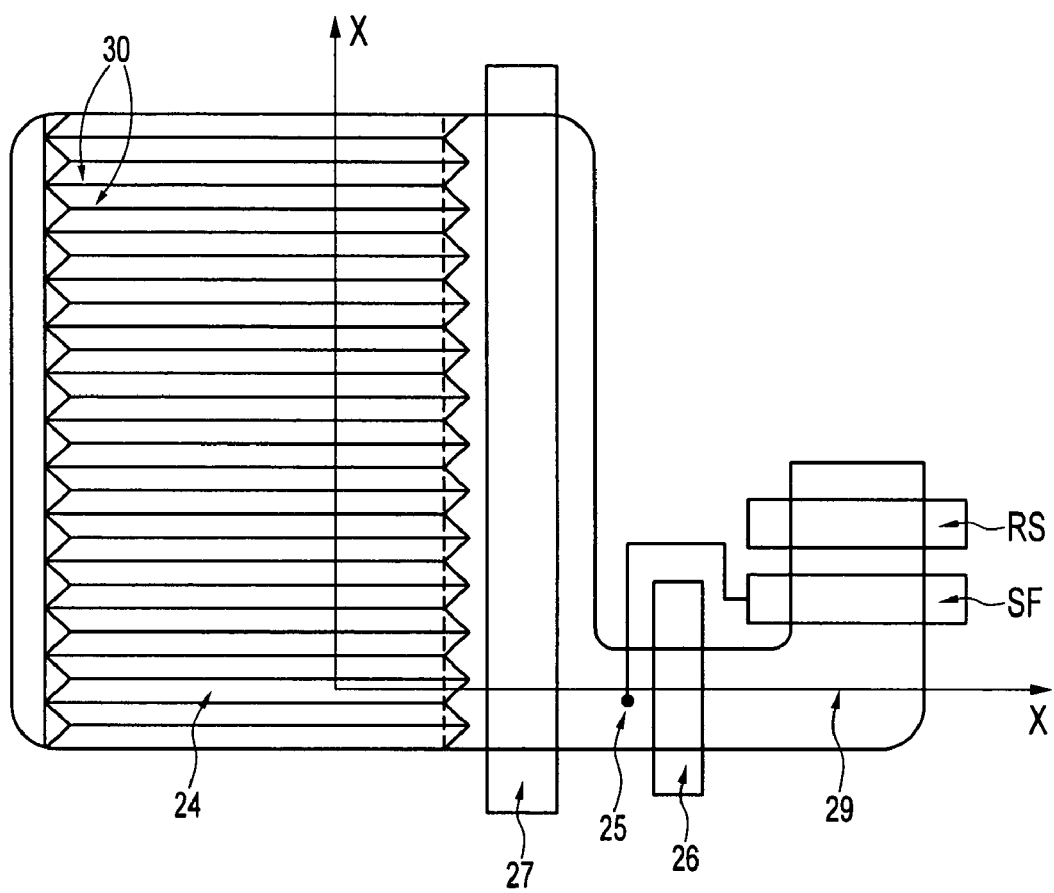
FIG. 6a is a plan view of a pixel having the configuration of FIG. 5b.
Figure 6B:
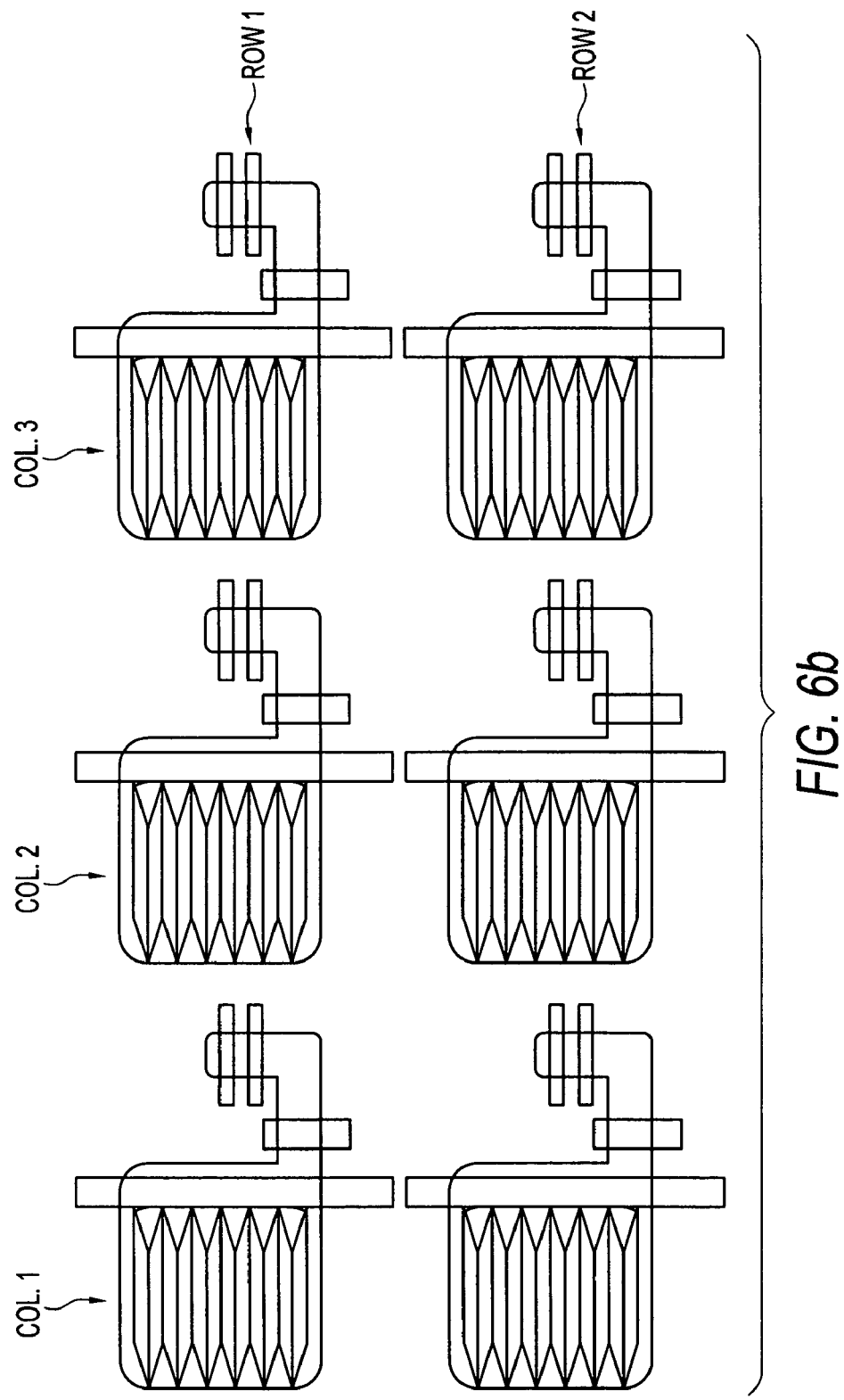

In the case of a prism-shaped configuration, reflecting surfaces are preferably located so that any scattered light will go to neighboring pixels that are not being read at the same time, thereby minimizing optical cross-talk. The layout of the prism-shaped configuration is illustrated in plan view in FIG. 6a, where the cross-section of FIG. 3 is taken along line X-X of FIG. 6a. The reflecting surfaces 30 are aligned such that the scattering occurs in a direction that is vertical to the direction that the image will be viewed, as illustrated in the pixel array of FIG. 6b, since the rows of pixels are typically read out as horizontal stripes. Such scattering is preferable since the human eye will not detect color cross-talk in the vertical direction as easily as in the horizontal direction.

Although the photodiode photosensor 24 of FIG. 3 is shown to have a series of sloped features, it should be noted that the invention is not limited to such an embodiment. As discussed above, a photosensor having a pitch greater than ¼ the wavelength of light is suitable. In addition, a photosensor according the present invention may have a single trench, rather than a series of sloped features.

Figure 7:
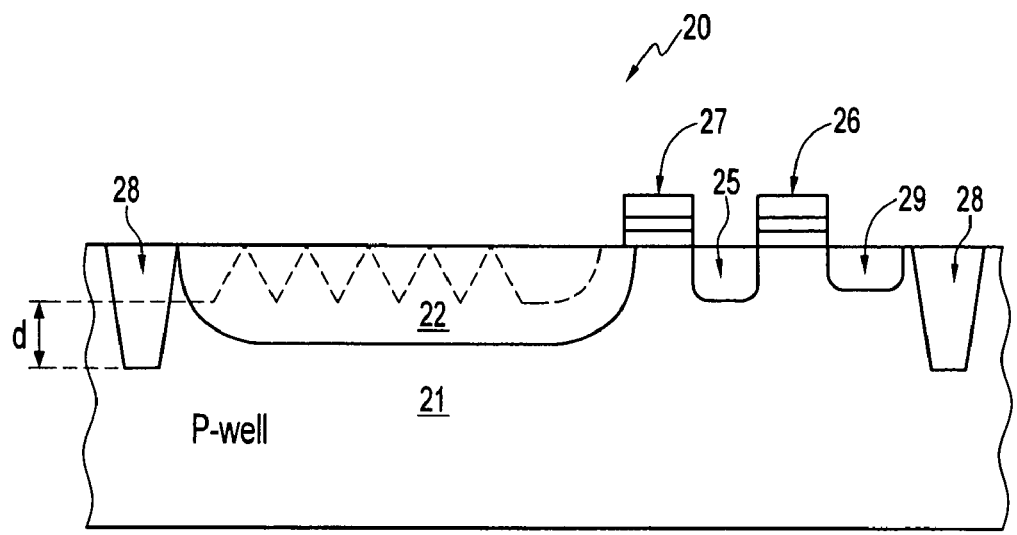
FIG. 7 is a cross-sectional view of the present invention at an early stage of fabrication.
Figure 8:
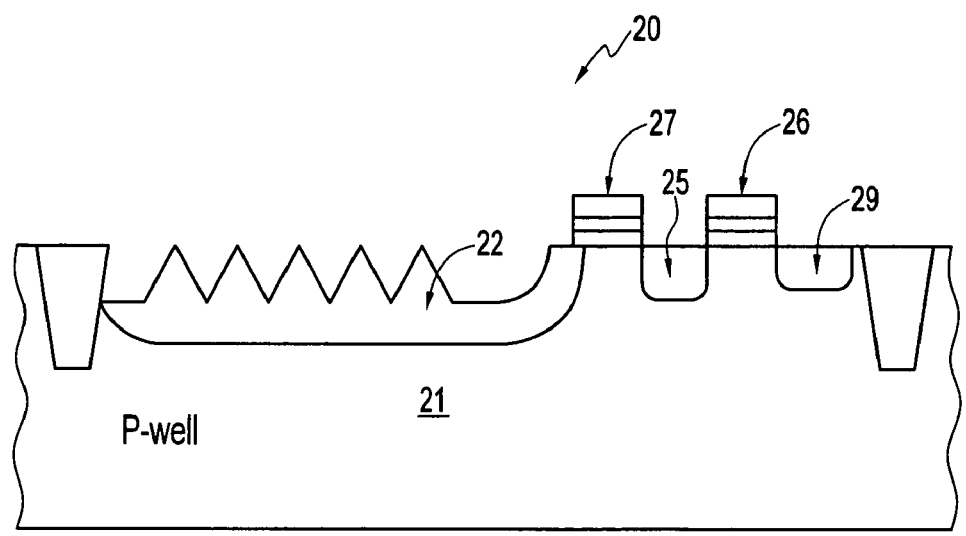
FIG. 8 is a cross-sectional view of the present invention at a stage of fabrication subsequent to FIG. 7.

The formation of the pixel cell 20 of the invention is now described. The earlier processing steps of the pixel 20 include any known steps that form transfer transistor 27, reset transistor 26, floating diffusion region 5, source/drain region 29, a p-type active layer 21 and an n-type photodiode region 22, as shown in FIG. 7. The isolation trench 28 should be formed to a depth of at least "d" deeper than the anticipated lowest top surface of the substrate, shown in FIG. 7 as a hashed line. The depth d is preferably greater than 2000 Å. A source follower transistor and a row select transistor are also formed (not shown). The substrate is then masked (not shown) and cones or prisms are etched out of n-type photodiode region 22, as shown in FIG. 8. The masking pattern and dry etch may be performed as described in U.S. Pat. No. 6,416,376 to Wilson and U.S. Pat. No. 5,391,259 to Cathey et al., which are hereby incorporated by reference. These masking and etching methods are used to form a substantially uniform array of sharp tips in the substrate by dry etching. The substrate may also be cleaned after the etching step, by washing in a wash of deionized water or buffered oxide etch, as described in the '376 patent.

Figure 9A:
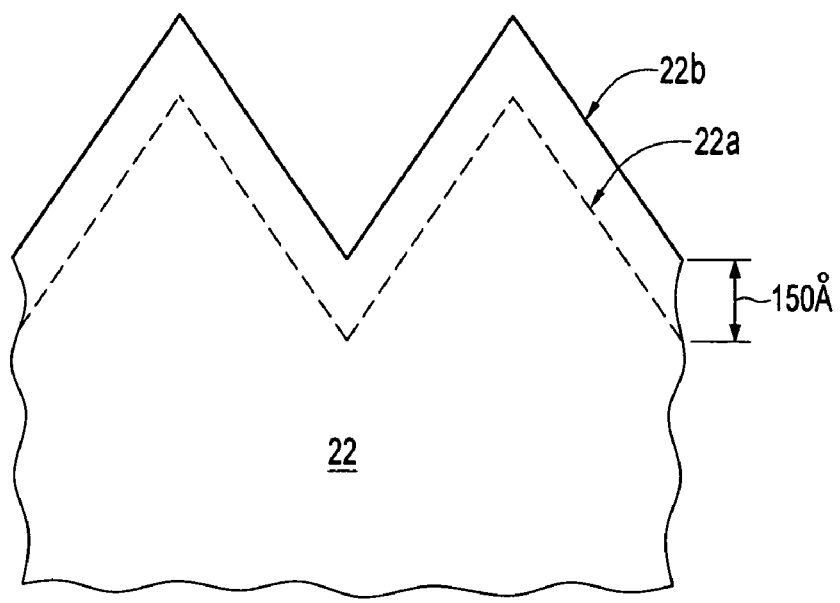
FIG. 9a is an expanded cross-sectional view of the present invention at a stage of fabrication subsequent to FIG. 8.
Figure 9B:
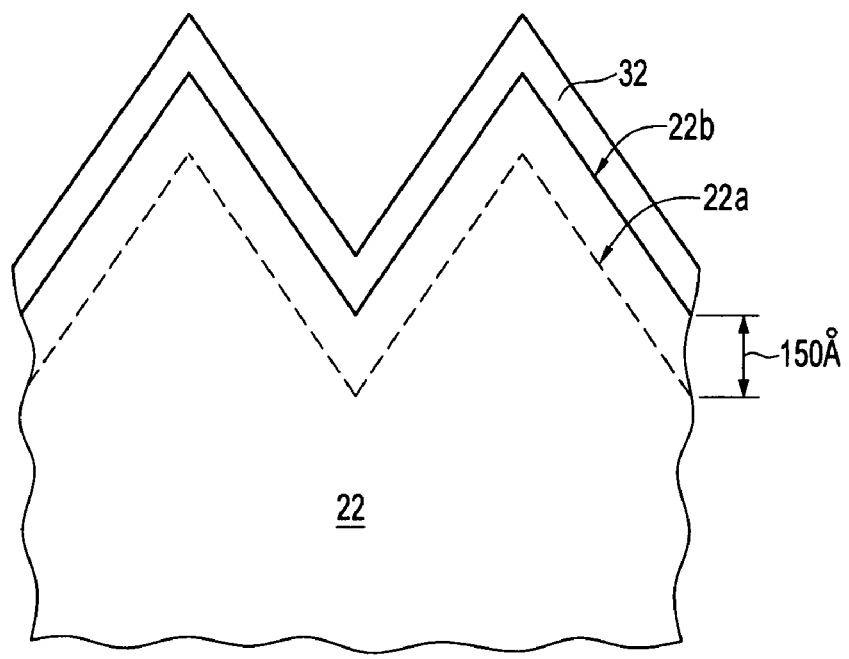
FIG. 9b is an expanded cross-sectional view of the present invention at a stage of fabrication subsequent to FIG. 9b.
Figure 9C:
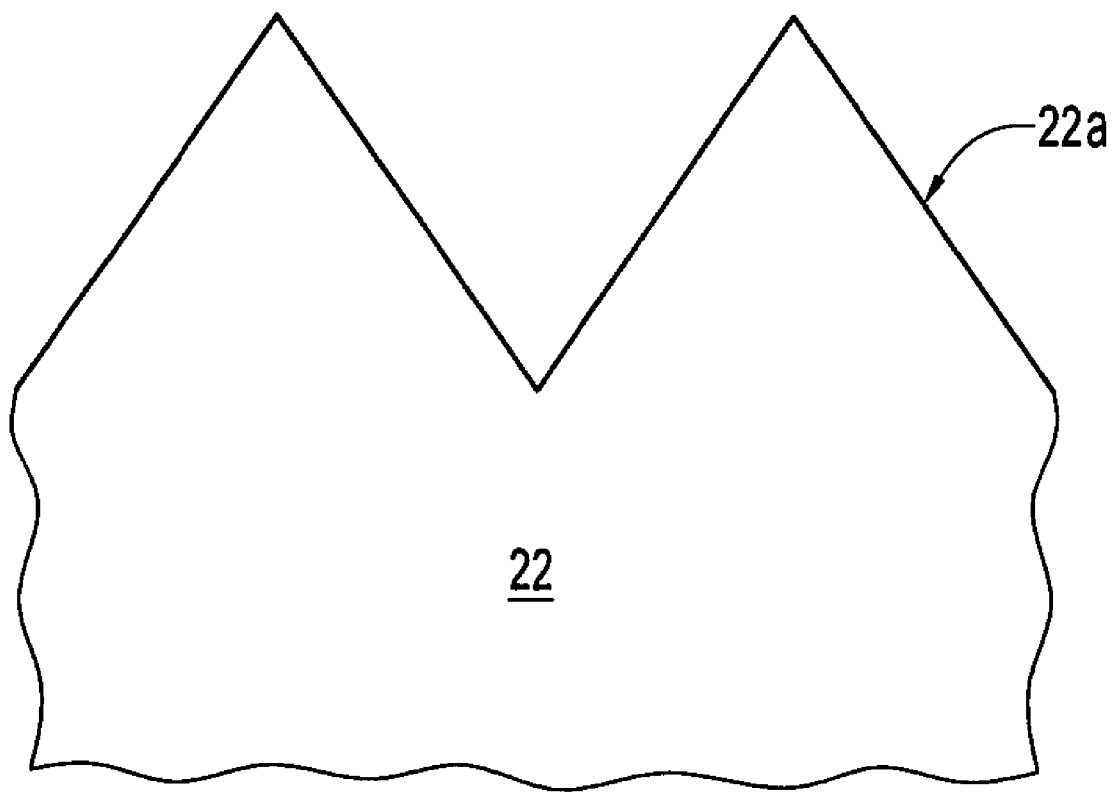
FIG. 9c is an expanded cross-sectional view of the present invention at a stage of fabrication subsequent to FIG. 9b.

Some defects in the silicon may result from the etching process. These defects may result in increased dark current from the photosensitive region. Therefore, the defects may be cured by techniques typically used on CMOS transistor gates. A first technique is illustrated in the expanded cross-section view of FIGS. 9a-9c. This first technique includes under-etching the cone or prism features from the final desired shape 22a (indicated in hashed lines) and depth by approximately 150 Å to produce a surface shape 22b, as shown in FIG. 9a. A sacrificial $SiO_2$ layer 32 is grown over the surface shape 22b of the features, as shown in FIG. 9b. A standard oxide process is performed, oxidizing the silicon such that the $SiO_2$ layer 32 is consumed by the defects and the desired depth and shape 22a of the surface of the features is obtained, as shown in FIG. 9c. For example, if a 200 Å layer of $SiO_2$ is deposited over the etched features of the silicon and undergoes a dry $O_2$ flow at 800° C., approximately 100 Å of the silicon is consumed.

A second technique includes treating the silicon with $H_2$. The $H_2$ treatment heals the dangling bonds of the defective silicon and allows the silicon to migrate to local energy minima at the surface of the silicon. Both the first and second techniques may be performed to minimize defects.

Referring back to FIG. 8, The final p-type surface layer 23 of FIG. 3 is formed by performing a shallow p-type doping implant over the n-type photodiode region 22. Formation of the remainder of the pixel 20 is performed using any known processing steps.

Figure 10:
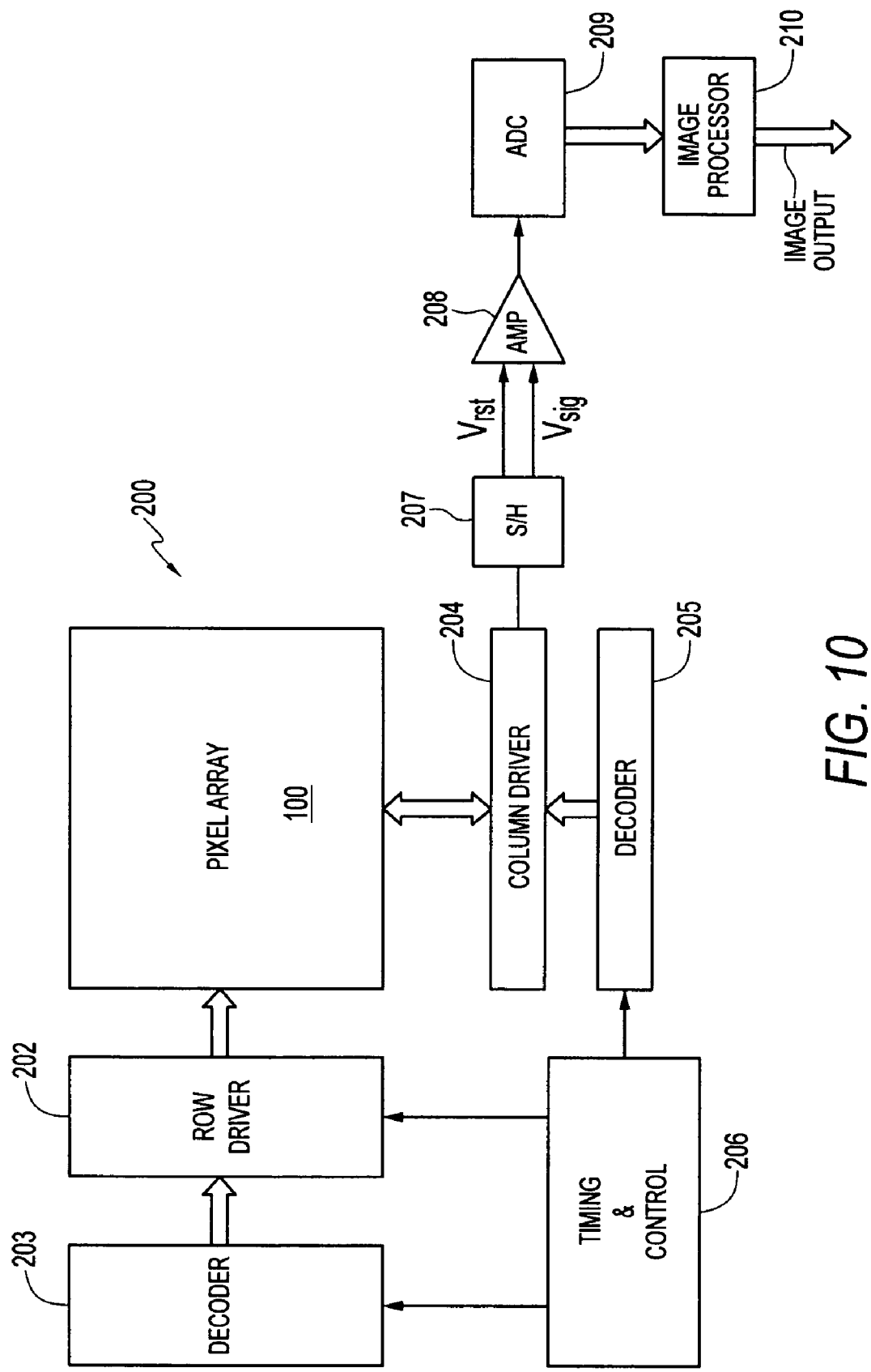
FIG. 10 is a block diagram of an imaging device according to the present invention.

FIG. 10 illustrates an exemplary imaging device 200 that may utilize pixels having photosensors constructed in accordance with the invention. The imaging device 200 has an imager pixel array 100 comprising a plurality of pixels with photosensors constructed as described above. Row lines are selectively activated by a row driver 202 in response to row address decoder 203. A column driver 204 and column address decoder 205 are also included in the imaging device 200. The imaging device 200 is operated by the timing and control circuit 206, which controls the address decoders 203, 205. The control circuit 206 also controls the row and column driver circuitry 202, 204.

A sample and hold circuit 207 associated with the column driver 204 reads a pixel reset signal Vrst and a pixel image signal Vsig for selected pixels. A differential signal (Vrst–Vsig) is produced by differential amplifier 208 for each pixel and is digitized by analog-to-digital converter 209 (ADC). The analog-to-digital converter 209 supplies the digitized pixel signals to an image processor 210 which forms and outputs a digital image.

FIG. 11 shows a typical processor system which includes the imaging device 200 (FIG. 10) of the invention. The processor system 900 is exemplary of a system having digital circuits that could include image sensor devices. Without being limiting, such a system could include a computer system, still or video camera system, scanner, machine vision, vehicle navigation, video phone, surveillance system, auto focus system, star tracker system, motion detection system, image stabilization system, and other imaging systems.

The processor-based system 900, for example a camera system, may comprise a central processing unit (CPU) 995, such as a microprocessor, that communicates with an input/output (I/O) device 991 over a bus 993. Imaging device 200 also communicates with the CPU 995 over bus 993. The processor system 900 also includes random access memory (RAM) 992, and can include removable memory 994, such as flash memory, which also communicate with CPU 995 over the bus 993. Imaging device 200 may be combined with a processor, such as a CPU, digital signal processor, or microprocessor, with or without memory storage on a single integrated circuit or on a different chip than the processor.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. For example, while the invention has been described as forming a photodiode photosensor having a p-n-p construction, an n-p-n or other construction may be used to form the photosensor. Accordingly, the invention is not to be seen as limited by the foregoing description, but is only limited by the scope of the appended claims.

What is claimed as new and desired to be protected by Letters Patent of the United States is:

1. An imaging device photosensor comprising:
a photosensitive region formed in a substrate; and
at least one sloped feature formed in said photosensitive region for redirecting reflected light from one portion of said photosensitive region to another portion of said photosensitive region, said at least one sloped feature oriented so that non-absorbed light is scattered towards portions of the imaging device that are not being read at a same time that the photosensor is being read.

2. The photosensor of claim 1, wherein said at least one sloped feature has a cone-shaped configuration.

3. The photosensor of claim 1, wherein said at least one sloped feature has a prism-shaped configuration.

4. The photosensor of claim 1, further comprising a plurality of sloped features formed in said photosensitive region.

5. The photosensor of claim 4, wherein the distance between any two sloped features is greater than approximately ¼ the wavelength of light to be absorbed by said photosensor.

6. The photosensor of claim 5, wherein a cross-section of any two adjacent sloped features form a v-shape.

7. The photosensor of claim 5, wherein a cross-section of any two adjacent sloped features form a hemispherical shape.

8. The photosensor of claim 5, wherein a cross-section of any two adjacent sloped features have a flat area between them.

9. The photosensor of claim 1, wherein said photosensor is a photodiode sensor.

10. A photosensor for use in an imaging device, said photosensor comprising:
a first doped layer of a first conductivity type formed in a substrate;
a second doped layer of a second conductivity type formed in said substrate over said first doped layer, wherein said second doped layer has at least one sloped feature having a sloped upper surface for redirecting reflected light from one portion of said photosensitive region to another portion of said photosensitive region;
a third doped layer of a first conductivity type formed in said upper surface of said at least one sloped features,
wherein the photosensor is oriented in the imaging device so that the at least one sloped feature scatters non-absorbed light towards portions of the imaging device that are not being read at a same time that the photosensor is being read.

11. The photosensor of claim 10, wherein said at least one sloped feature has a cone-shaped configuration.

12. The photosensor of claim 10, wherein said at least one sloped feature has a prism-shaped configuration.

13. The photosensor of claim 10, further comprising a plurality of sloped features formed in said second doped layer in said substrate.

14. The photosensor of claim 10, wherein said first conductivity type is p-type.

15. The photosensor of claim 14, wherein said second conductivity type is n-type.

16. The photosensor of claim 13, wherein the distance between any two adjacent sloped features is greater than approximately ¼ the wavelength of light to be absorbed by said photosensor.

17. The photosensor of claim 16, wherein a cross-section of any two adjacent sloped features form a v-shape.

18. The photosensor of claim 16, wherein a cross-section of any two adjacent sloped features form a hemispherical shape.

19. The photosensor of claim 16, wherein a cross-section of any two adjacent sloped features has a flat area between them.

20. An imager device comprising:
an array of pixels, each comprising:
a photosensitive region formed in a substrate; and
at least one sloped feature formed in said photosensitive region for redirecting reflected light from one portion of said photosensitive region to another portion of said photosensitive region, said at least one sloped feature oriented so that non-absorbed light is scattered away from pixels on a same row as the pixel scattering the light.

21. The imager device of claim 20, wherein said at least one sloped feature comprises photosensitive materials.

22. The imager device of claim 20, wherein said at least one sloped feature has a cone-shaped configuration.

23. The imager device of claim 20, wherein said at least one sloped feature has a prism-shaped configuration.

24. The imager device of claim 20, further comprising a plurality of sloped features formed in said photosensitive region.

25. The imager device of claim 24, wherein the distance between any two sloped features is greater than approximately ¼ the wavelength of light to be absorbed by said photosensor.

26. The imager device of claim 25, wherein a cross-section of any two adjacent sloped features form a v-shape.

27. The imager device of claim 25, wherein a cross-section of any two adjacent sloped features form a hemispherical shape.

28. The imager device of claim 25, wherein a cross-section of any two adjacent sloped features have a flat area between them.

29. The imager device of claim 20, wherein said photosensor is a photodiode sensor.

30. An image processor comprising:
a processor;
a pixel array coupled to said processor comprising:
a photosensor having a photosensitive area, wherein said photosensitive area has at least one sloped feature on a top surface for redirecting reflected light from one portion of said photosensitive region to another portion of said photosensitive region, said at least one sloped feature oriented so that non-absorbed light is scattered away from pixels on a same row as the pixel scattering the light.

31. The image processor of claim 30, further comprising a plurality of sloped features on said top surface.

32. The image processor of claim 30, wherein said at least one sloped feature has a cone-shaped configuration.

33. The image processor of claim 30, wherein said at least one sloped feature has a prism-shaped configuration.

* * * * *

UNITED STATES PATENT AND TRADEMARK OFFICE
CERTIFICATE OF CORRECTION

| | |
|---|---|
| PATENT NO. | : 7,456,452 B2 |
| APPLICATION NO. | : 11/300378 |
| DATED | : November 25, 2008 |
| INVENTOR(S) | : Wells et al. |

Page 1 of 1

It is certified that error appears in the above-identified patent and that said Letters Patent is hereby corrected as shown below:

In column 7, line 50, in Claim 10, delete "features," and insert -- feature, --, therefor.

Signed and Sealed this

Tenth Day of March, 2009

JOHN DOLL
*Acting Director of the United States Patent and Trademark Office*